United States Patent [19]
Horigane et al.

[11] Patent Number: 5,759,797
[45] Date of Patent: Jun. 2, 1998

[54] APPARATUS AND METHOD FOR ANALYZING PHYSIOLOGICAL STATE OF ORGANISM

[75] Inventors: Akira Horigane; Hisashi Yoshida; Ushio Matsukura; Yoshihiko Nawa; Noboru Horisue, all of Tsukuba; Masayoshi Kamio, Tsuchiura, all of Japan

[73] Assignee: Director General of National Agriculture Research Center, Ministry of Agriculture, Forestry and Fisheries, Tsukuba, Japan

[21] Appl. No.: 496,252

[22] Filed: Jun. 28, 1995

[30] Foreign Application Priority Data

Jun. 23, 1995 [JP] Japan .................................. 7-158138

[51] Int. Cl.$^6$ .................. C12Q 1/02; C12Q 1/00; A01N 1/02; H01H 47/00
[52] U.S. Cl. .................. 435/29; 435/4; 435/283.1; 422/186; 422/186.01; 422/50; 422/55; 361/143; 436/173; 128/653.1; 128/653.2; 310/152
[58] Field of Search .................. 435/29, 4, 283.1; 128/653.1, 653.2, 66.01; 361/143; 436/173; 601/97, 3; 324/318; 422/50, 55, 186, 186.01; 310/152

[56] References Cited

U.S. PATENT DOCUMENTS

| | | | |
|---|---|---|---|
| Re. 33,259 | 7/1990 | Crooks et al. | 324/318 |
| 4,471,305 | 9/1984 | Crooks et al. | 324/318 |
| 5,124,650 | 6/1992 | Granot | 324/318 |
| 5,125,408 | 6/1992 | Basser | 128/653.2 |

FOREIGN PATENT DOCUMENTS 0 248 924   12/1987   European Pat. Off. .

OTHER PUBLICATIONS

Soviet Inventions Illustrated, El. Section, Week 8416, May 30, 1984, and SU-A-994 968.
Patent Abstracts of Japan, unexamined applications, P field, vol. 15, No. 320, Aug. 15, 1991, The Patent Office Japanese Government, p. 35, p. 1238; & JP-A-03 115 846.

*Primary Examiner*—Louise Leary
*Attorney, Agent, or Firm*—Flynn, Thiel, Boutell & Tanis, P.C.

[57] ABSTRACT

An apparatus and a method for analyzing the physiological state of a sample of a living organism of eucaryotes and procaryotes, e.g., plants, seeds, tissues, calluses and microorganisms, which permits the examination of the sample for its physiological state internally in a successive and non-destructive manner to thereby enable the analysis of the change of the sample in the histomorphological and metabolic aspect due to the growth thereof, by

- arranging, within the hollow core space of a magnetic field generator composed of a stationary magnetic field generating coil and a gradient magnetic field generating coil,
- a detection unit and an RF-emission-reception set; supporting the resulting assembly on an air feed duct which also serves supporting beam;
- placing a sample holder with the sample of an organism being included therein within the detection unit;
- maintaining the detection unit at a constant temperature by supplying warm air or cold air thereto via the air feed duct, while supplying thereto a liquid feed and a gas feed via a liquid feed tube and gas feed tube, respectively, to let the sample grow;
- actuating the RF-emission-reception set to emit RF pulses from an RF coil and to receive the resulting MR signals from the sample;
- and processing the MR signals into corresponding MR image and/or spectrum, in order to analyze the change in the physiological state of the sample organism.

12 Claims, 5 Drawing Sheets ical probe and the cradle into the hollow core space, some disturbance in the static magnetic field occurs, which is removed by shimming to homogenize the magnetic field. Then, a gradient magnetic field is generated by energizing the coil in the gradient magnetic field generator while, at the same time, actuating the RF coil of the RF-emission-reception set to emit RF pulses to the sample via the RF coil to cause the magnetic resonance thereof. These MR signals are received by the RF coil upon cessation of emission of the RF pulses and are processed by a computer into a corresponding image which is visualized on a display.

However, these conventional MRI apparatuses are not adapted for analyzing the physiological states of organisms, such as the state of growth of a sample of an organism, for example, a plant, seed, tissue, callus or a microorganism, in particular, for analyzing the course of change thereof so as to attain a successive quality assessment and chemical analysis, since the conventional apparatuses are based on the same principle as those for use in medical diagnoses.

APPARATUS AND METHOD FOR ANALYZING PHYSIOLOGICAL STATE OF ORGANISM

FIELD OF THE INVENTION

The present invention relates to an apparatus and a method for analyzing the physiological state of a living organism of procaryotes and eucaryotes, for example, plants, seeds, tissues, calluses and microorgamisms, in a dynamic or static way, by means of the technique of magnetic resonance imaging (denoted hereinafter by the acronym MRI).

BACKGROUND OF THE INVENTION

For attaining assessments and analyses of germination characteristics, cultivation conditions and other characteristics of agricultural plants, metabolic processes of microorganisms and other biological processes, they are cultivated or grown and the state of growth thereof is observed and recorded. Heretofore, such observations only allowed an external inspection for successive observations of physiological conditions, such as the state of growth etc., of an organism. It was necessary to cut or slice the organism, in order to perform an observation of its internal state, with the inevitable interruption of the growth thereof, so that it has been impossible to attain successive internal observation over the entire growth course. It has also been impossible to carry out internal observation of a sample of a crop and chemical analyses of the grown product simultaneously during its cultivation, rendering the observation results not very valuable by itself.

In MRI, a reaction of the atomic nucleus of hydrogen, phosphorus, $^{13}C$ and so on with an electromagnetic wave (of, for example, 200 MHz a hydrogen atom) in a strong magnetic field generated by a superconducting magnet, to cause resonance therewith, namely, the phenomenon of so-called magnetic resonance (MR), is utilized for performing imaging and spectral analysis of a sample to be inspected in a non-desructive way. MRI apparatuses have found wide uses in the medical field for clinical tests for diagnosis of tumors, intracerebral bleeding and so on.

The MRI technique permits the performing to an image-visualized diagnosis and a spectral analysis by making use of the phenomenon of MR of, for example, hydrogen atom nuclei, thus allowing a non-destructive observation of the internal structure and the chemical composition of a sample to be inspected. Due to the permeability of materials and capability of obtaining the spectrum corresponding to the existing functional groups in the material, MRI is also used for other analytical purposes including a non-destructive histological observation and compositional analysis of a sample. MRI apparatuses to be used for such non-destructive quality assessments and analyses of samples are also based on the same principle as the MRI apparatuses for medical diagnosis, so that both have nearly the same construction.

In order to obtain an MR image of an organism by a conventional MRI apparatus, a cradle carrying a sample holder charged with a sample of the organism is placed within the hollow core space of the stationary magnetic field generator at a prescribed position thereof and fixed to the gradient magnetic field generator. Then, the RF-emission-reception set contained in a cylindrical probe placed within the cradle is tuned at the resonating frequency using tuner shunks. Due to the insertion of the sample, the cylindri-

SUMMARY OF THE INVENTION

An object of the present invention is to provide an apparatus and a method for analyzing the physiological state of an organism, by which successive analyses of the physiological state of an organism, including the state of growth of a growing sample of the organism, can be realized for the internal structure thereof in a non-destructive manner.

The apparatus for analyzing the physiological state of an organism according to the present invention comprises a magnetic field generator for building up a stationary magnetic field and a gradient magnetic field within the hollow core space of the generator, a detection unit disposed in said hollow core space and adapted to be charged internally with a sample of the organism, a circumstance regulator for maintaining the sample of the organism within said detection unit in a preset circumstance and an RF-emission-reception set having an RF coil located within said hollow core space for emitting RF pulses to the sample organism held in the detection unit and receiving the resulting magnetic resonance signals of the sample organism.

The analysis of the physiological state of an organism can be carried out by placing a detection unit charged internally with a sample of the organism within the hollow core space of a magnetic field generator, maintaining the sample organism within said detection unit in a preset circumstance by means of a circumstance regulator, operating an RF-emission-reception set having an RF coil so as to emit RF pulses to the sample organism and to receive the resulting magnetic resonance signals of the sample organism via the RF coil and processing the signals into a corresponding image and/or spectrum to thereby attain analysis of the physiological state of the sample organism.

DETAILED DESCRIPTION OF THE INVENTION

Figure 1:
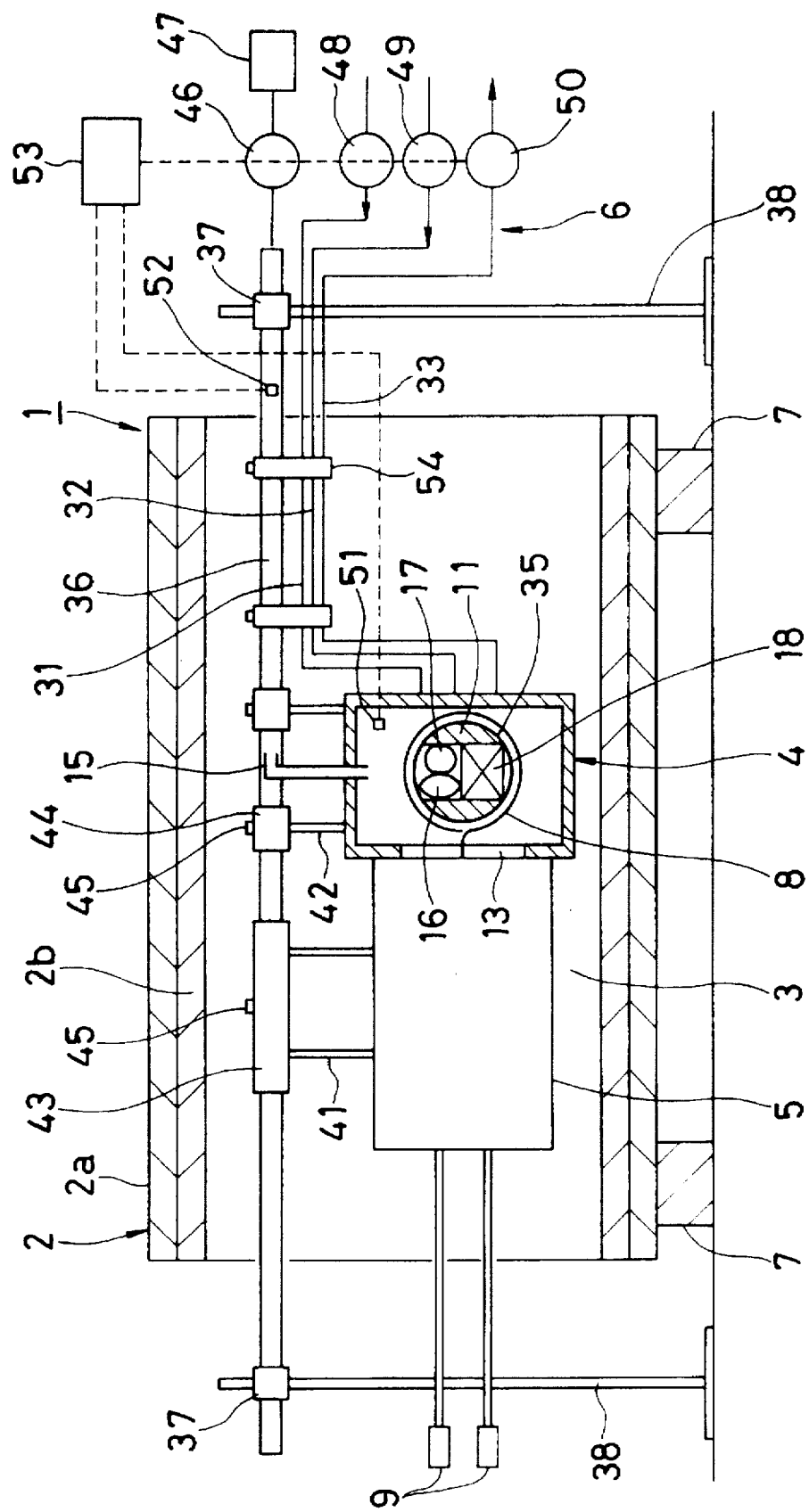
FIG. 1 shows an embodiment of the apparatus for analyzing the physiological state of an organism according to the present invention in a vertical section.

The apparatus for analysing the physiological state of an organism according to the present invention is constructed by incorporating a specific detection unit and a circumstance regulator in a commercially available conventional MRI apparatus, with which the contemplated analysis of the physiological state of the organism is carried out by maintaining a sample of the organism in a preset circumstance and producing an MR image and/or spectrum of the organism.

The apparatus according to the present invention can be designed to be adapted to perform the analysis of the growth state of an organism by growing a sample of the organism and to inspect the sample organism by MR images and/or spectra obtained during the growth of the sample organism.

By the "sample" as used herein is meant any sample of eucaryotic or procaryotic organisms including plants, seeds, tissues, calluses and microorganisms.

For the MRI apparatus containing the magnetic field generator, the RF-emission-reception set and so on, commercial articles may be employed. For the stationary magnetic field generating element of the magnetic field generator, it is preferable to use a superconducting magnet having a horizontally laid cylindrical form with an axially extending hollow core space. The gradient magnetic field generating element of the magnetic field generator is designed to build up a magnetic field with gradient components in the x-, y- and z-coordinate directions. The RF-emission-reception set has an RF coil and may be designed either in a form in which one and the same element is used as the emitter and as the receiver or in a form in which separate elements are used as the emitter and receiver.

For performing an analysis of the physiological state of an organism using the apparatus according to the present invention, the detection unit is charged with a sample of the organism and is then placed within the hollow core space of the magnetic field generator, whereupon the sample is held in a preset circumstance of definite atmosphere, temperature, humidity and so on by means of the circumstance regulator. In this condition, the RF-emission-reception set is operated to actuate the RF coil to emit RF pulses to the sample and to receive the resulting magnetic resonance signals from the sample, which are processed into a corresponding image and/or spectrum to attain the contemplated analysis of the physiological state of the sample organism. Here, it is possible to obtain a dynamic analysis of the change in the physiological state of the sample by carrying out successive observations of the sample.

For analyzing the state of growth of a growing organism, the detection unit charged with a sample of the organism is placed within the hollow core space of the magnetic field generator, whereupon the sample is held in a suitable growing circumstance by adjusting the rates of the gas and liquid feeds and the temperature by means of the circumstance regulator to grow the sample organism. During the above process step, the RF-emission-reception set is operated either successively or intermittently to actuate the RF coil to emit RF pulses to the sample and to receive the resulting magnetic resonance signals from the sample, which are processed into corresponding image and/or spectrum to attain the contemplated static or dynamic analysis of the physiological state of the sample organism.

In this case, the histomorphological analysis of physiological variations, changes in metabolism and so on, incidental to a specific circumstance or condition of growth of an organism can be attained by analyzing the MR image in combination with the spectrum of a specific chemical component, such as a sugar, to thereby assess the germination characteristics and cultivation conditions of an agricultural plant, in order to contribute to the breeding of cultured plants and to the improvement of culture conditions.

By the apparatus and method for analyzing the physiological state of an organism according to the present invention, the physiological state of the organism can be analyzed successively in a non-destructive way with a sample of the organism from an MR image and/or spectrum thereof, by arranging an RF-emission-reception set and a detection unit including the sample organism within the hollow core space of the magnetic field generator and maintaining the sample organism in a preset circumstance using a circumstance regulator.

By the apparatus and method according to the present invention, the state of growth of the organism, also with respect to the internal state of tissues thereof, can be analyzed successively in a non-destructive way with a sample of the organism from an MR image and/or spectrum thereof, by arranging, within the hollow core space of the magnetic field generator, an RF-emission-reception set and a detection unit including the sample organism and growing the sample organism while maintaining it in a preset circumstance using a circumstance regulator, whereby it is possible to analyze histomorphological variations and changes in the metabolism of the sample organism incidental to the growth thereof.

PREFERRED EMBODIMENT OF THE INVENTION

Below, the present invention is further described with reference to the appended Drawings.

Figure 2:
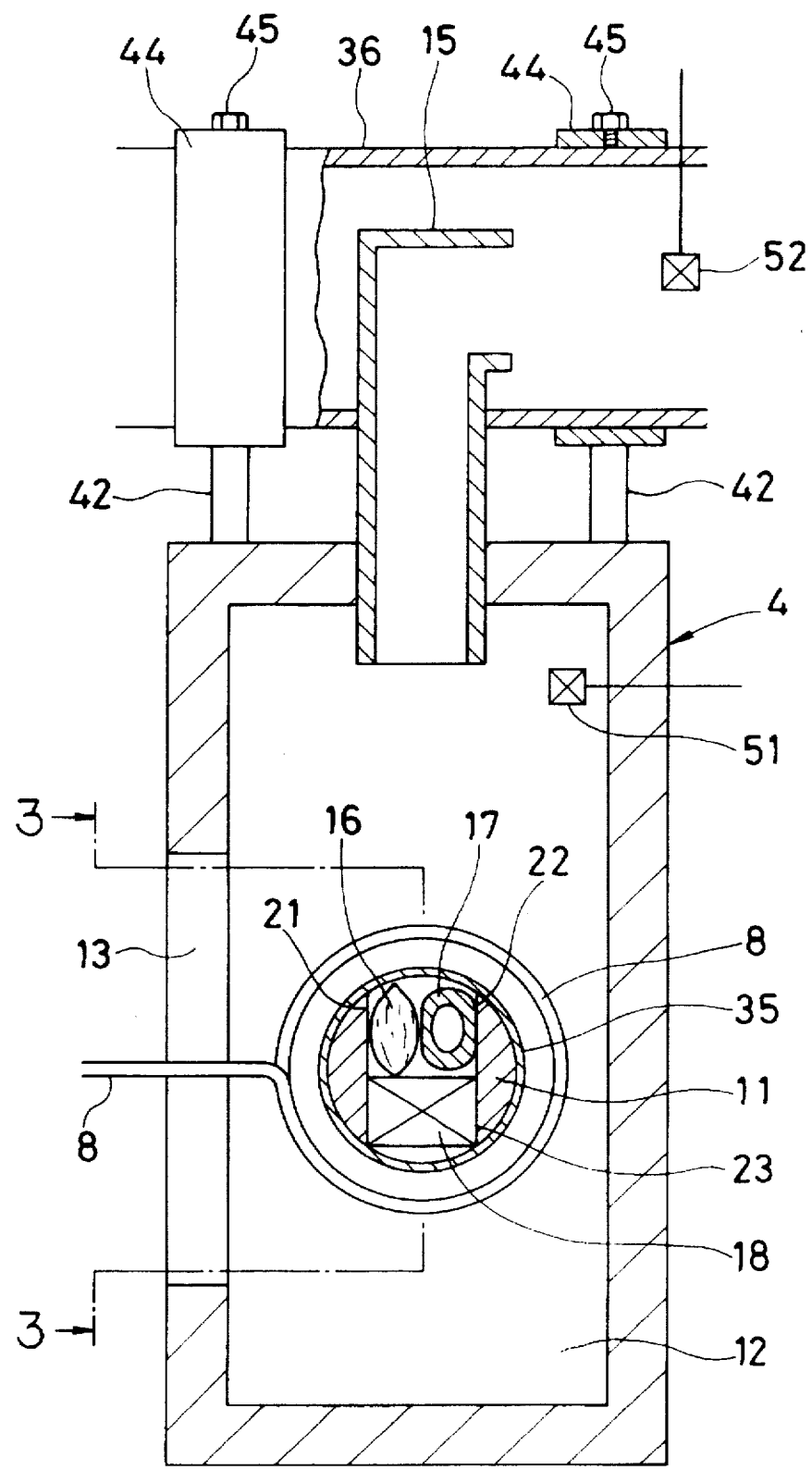
FIG. 2 is a partial enlargement of FIG. 1.
Figure 3:
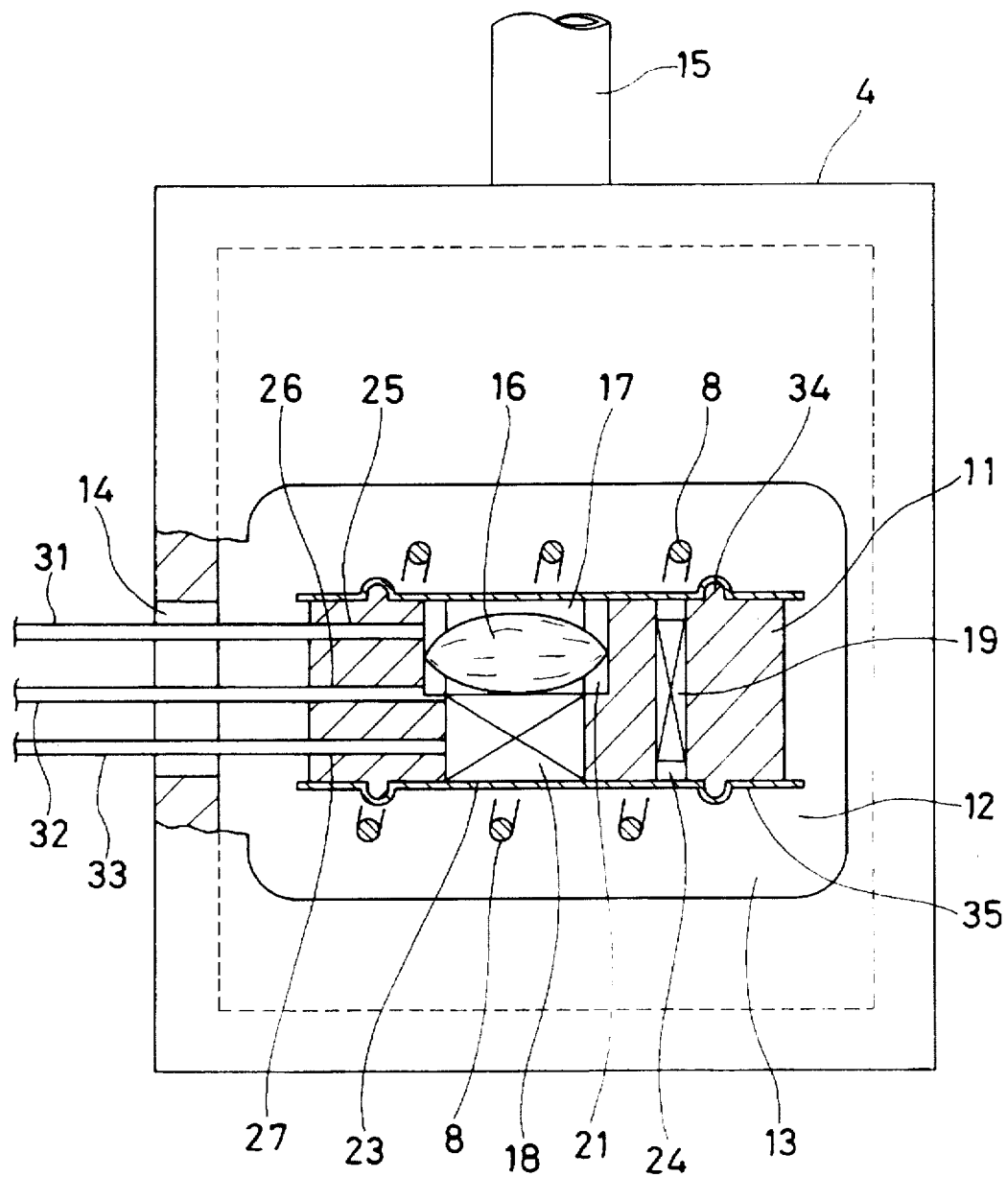
FIG. 3 shows a section of the part shown in FIG. 2 along the line A—A.
Figure 4:
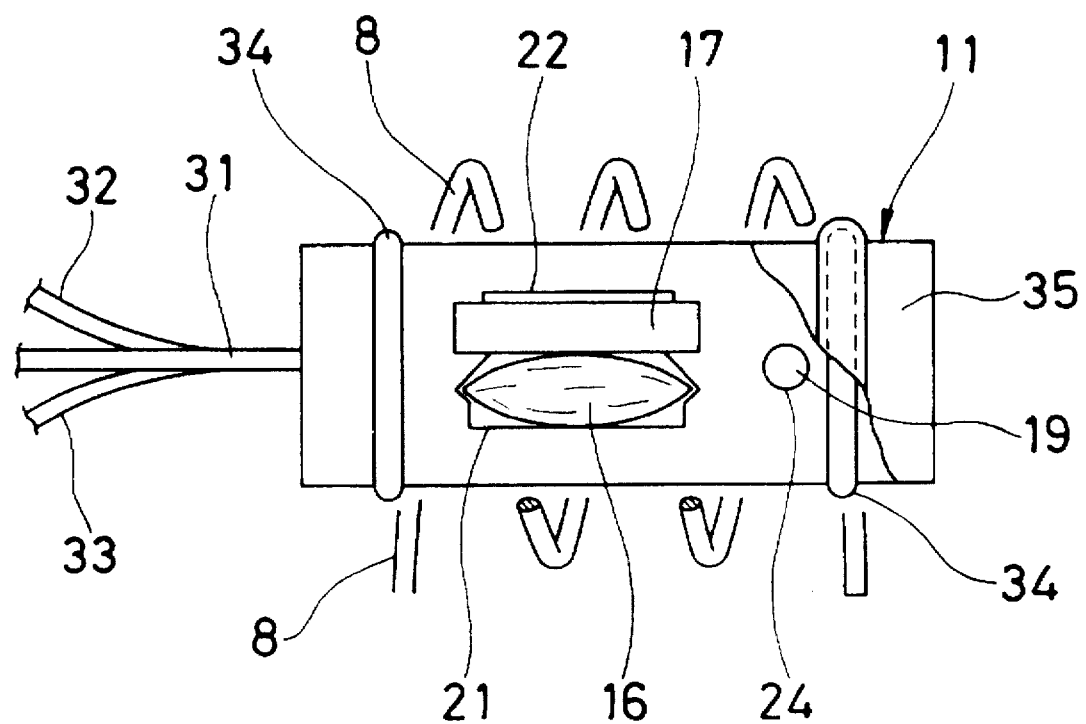
FIG. 4 shows an embodiment of the sample holder in a plan view.

FIGS. 1–4 show an embodiment of the apparatus according to the present invention for analyzing the state of growth of a sample organism, in which FIG. 1 is a vertical section, FIG. 2 is a part thereof in an enlarged view, FIG. 3 is a section along the line A—A of FIG. 2 and FIG. 4 is a plan of the sample holder.

In FIG. 1, the growth state analyzing apparatus is indicated by the numeral 1, in which a magnetic field generator 2 of cylindrical form accommodates within its hollow core space 3 a detection unit 4 and an RF-emission-reception set 5. The detection unit 4 is so designed that a predetermined growing circumstance is maintained by a circumstance regulator 6.

The magnetic field generator 2 is composed of a stationary magnetic field generating coil 2a constituted of a horizontally laid cylindrical superconducting magnet and a gradient magnetic field generating coil 2b disposed inside the coil 2a coaxially therewith, in which the hollow core space 3 is formed and the entire body is supported on stands 7.

The RF-emission-reception set 5 includes capacitors, such as a trimmer capacitor, a chipping capacitor and so on, accommodated therein. From one side end of the RF-emission-reception set 5, lead wires extend out to connect with an RF coil 8 disposed within the detection unit 4 and wound around the sample holder 11 and, from the other side end, tuner shunks 9 project out of the magnetic field generator 2.

The magnetic field generator 2 and the RF-emission-reception set 5 constitute an MRI arrangement which operates to produce imaging signals to be processed into corresponding image and/or spectrum by a computer, a detailed depiction of which is omitted here.

The detection unit 4 is constructed in a form of a hollow casing, as shown in FIGS. 2–4, and includes, within the internal space 12 thereof, the sample holder 11 with the RF coil 8 wound around it. In the side walls of the detection unit 4, an opening 13 for guiding the sample holder 11 into the space 12 and an opening 14 for guiding tubes into the space 12, respectively, are provided and a warm air introducing tube 15 which opens into the internal space 12 projects out of the ceiling of the detection unit.

The sample holder 11 has a cylindrical form and includes therein, in an adjoining relation, a sample receiving pocket 21 for receiving the sample 16 and a sample arrester receiving pocket 22 for receiving a sample arrester 17. Beneath them, a pad 18 is provided and held in a pad holding pocket 23 formed in the lower part of the sample holder 11. Separately and spaced from them, a standard substance receiving pocket 24 extending radially of the sample holder is provided for receiving a standard substance 19.

One end part of the sample holder 11 is provided with a liquid feed tube receiving hole 25 and a gas feed tube receiving hole 26 and, in addition, a liquid drain tube receiving hole 27. They serve for receiving a liquid feed tube 31, a gas feed tube 32 and a liquid drain tube 33 for draining the spent liquid via the pad holding pocket 23, respectively, which are guided through the opening 14.

Around the outer circumference of the sample holder 11, there are formed two circumferential ribs 34 each at a portion near the end. The sample holder 11 is sleeved by a longitudinally split sleeve 35 capable of resiliently tightening the sample holder and serves for holding the sample 16, the sample arrester 17, the pad 18 and the standard substance 19 in each respective receiving pocket. The ribs are provided in order to prevent the sleeves 35 from falling off. The RF coil 8 is wound to fasten it around the sleeve 35 to fasten it to hold the sample holder fixedly, though it is shown in the Drawing separate from the sleeve 35.

The detection unit 4 and the RF-emission-reception set 5 are combined together integrally and fixed to an air feed duct 36, serving as a supporting beam, by suspension rods 41, 42 and fixing screws 45 via guide members 43, 44. The air feed duct 36 is mounted on a pair of supporting pillars 38 using a fixing joint 37 so as to permit adjustment of the elevation and the horizontal position.

The circumstance regulator 6 is composed of the air feed duct 36 connected with the warm air introducing tube 15, a blower 46 for supplying the air feed duct 36 with a warm air or cold air, a temperature regulator 47, the liquid feed tube 31, a liquid feed pump 48 connected with the liquid feed tube 31, a gas feed tube 32, a gas feed blower 49 connected with the gas feed tube 32, the liquid drain tube 33, the liquid drain pump 50 connected to the liquid drain tube 33, thermosensors 51 and 52 disposed in the detection unit 4 and in the gas feed duct 36, and a control unit 53. Suspending members 54 support the tubes 31, 32 and 33 by suspending them from the gas feed duct 36.

For performing the method for analysing the physiological state of an organism using the apparatus as described above, the sample receiving pocket 21 of the unsheathed sample holder 11 is charged with a sample 16 of the organism, for example, a seed of a plant (a seed of wheat in this Example), and then, the sample arrester 17 (a short soft plastic tube) is placed in the arrester receiving pocket 22 to arrest the seed 16 to avoid any vibration thereof. A water-permeable pad 18 made of, for example, unwoven cloth is inserted in the pad receiving pocket 23 and the standard substance receiving pocket 24 is charged with a standard substance 19, such as a glass ampule filled with water as the standard substance. In this state, the sample holder 11 is sheathed with the sleeve 35 and the so-assembled sample holder 11 is placed and fixed on the internal circumference of the RF coil 8.

The RF coil now carrying the sample holder 11 is guided into the hollow space 12 of the detection unit 4 through the opening 13. Then, the liquid feed tube 31, the gas feed tube 32 and the liquid drain tube 33 are inserted into the detection unit 4 through the opening 14 by inserting them in the liquid feed tube receiving hole 25, in the gas feed tube receiving hole 26 and in the liquid drain tube receiving hole 27 of the sample holder 11, respectively, to build up the path connection.

Then, the gas feed duct 36 is guided through the guide members 43, 44 and through the suspending members 54 and is fixed thereto at each adequate position by fixing screws 45. The resulting assemblage is then interted into the core space 3 of the magnetic field generator 2 together with the detection unit 4 and the RF-emission-reception set 5 and is fixed on the pair of supporting pillars 38 which adjust the elevation and the horizontal position by the fixing joints 37.

In this state, the apparatus is operated by actuating the control unit 53 so as to control the blower 46, the temperature regulator 47 and the pumps 48, 49 and 50 to maintain the circumstance in the sample receiving pocket 21 of the sample holder 11 in a predetermined growing condition, in order to grow the living sample 16 of the organism in the sample holder. Here, the temperature regulator 47 is controlled in accordance with the control signals from the heat sensors 51 and 52 corresponding to the temperatures of the detection unit 4 and of the air feed duct 36, so as to adjust the blowing rate and the temperature of warm or cold air fed by the blower 46, in order to maintain the circumstance in the detection unit 4 in an adequate condition. The air delivered by the blower 46 enters the detection unit 4 from the air feed duct 36 via the warm air introducing tube 15 and is discharged out of the detection unit 4 through the opening 13 and the opening 14 into the hollow core space 3 of the magnetic field generator 2.

By operating the gas feed blower 49, the feed gas, such as air, nitrogen gas or the like is supplied to the sample holder 11 via the gas feed tube 32 to maintain a definite aerobic or anaerobic atmosphere in the sample receiving pocket 21. By the operation of the liquid feed pump 48, the sample holder 11 is supplied with a liquid of a composition requisite for growing the sample organism, such as water, a culture medium or the like, via the liquid feed tube 31, to thereby soak the pad 18 therewith, while attaining at the same time maintenance of a constant humidity thereof. The superfluous portion of the liquid is drained by the liquid drain pump 50 through the liquid drain tube 33. The gas feed supplied from the gas feed tube 32 is discharged out through the existing gaps.

In this manner, the sample holder 11 is adjusted internally in a definite condition of the atmosphere, temperature and humidity, whereby the sample 16 can grow with pertinent respiration and water intake. During the growth course, the sample 16 of an organism can be examined successively by its MR image and/or spectrum to thereby attain an analysis of its physiological condition, in particular, the growth state of the sample organism 16 under a specific circumstance.

For producing the MR image, the magnetic field generator 2 is actuated so as to build up a stationary magnetic field within the hollow core space thereof by energizing the stationary magnetic field generating coil 2a and to superpose thereon a gradient magnetic field by energizing the gradient magnetic field generating coil 2b, whereupon the tuning is effected by manipulating the tuner shunks 9 by shimming. Then, the RF-emission-reception set 5 is actuated so as to cause emission of RF pulses from the RF coil 8, whereupon the resulting MR signals emitted from the sample 16 and from the standard substance 19 are compared and processed and are reconstructed into the corresponding MR image and/or spectrum.

The MR image and the spectrum of a sample organism can be obtained in a specific slice section of the sample and such slice section can be selected and shifted voluntarily in a continuous or intermittent manner in the MRI examination of the growth state of the sample organism, so that a dynamic analysis of the physiological condition of a living organism can be performed. By MRI, a spectral analysis of a specific compound in the sample organism is possible. Thus, it is possible by the apparatus according to the present invention to examine the sample organism by a combination of an MRI analysis with a spectral analysis of a specific compound, such as a sugar, in the sample, to thereby attain a combined assessment by the observation of changes in the histomorphological and metabolic aspects of the sample with respect to, for example, the germination characteristics, pertinent cultivation conditions and so on, to contribute to the development of breeding and improvement of cultivation condition of agricultural plants, etc.

The apparatus described above prevents of any influence of mechanical motion by, for example, pumps and blowers, on the resulting MRI image, since the detection unit 4 and the RF-emission-reception set 5 are disposed within the hollow core space 3 of the magnetic field generator 2 and the sample organism is maintained in a definite growing circumstance by effecting the supply of gas and liquid isolatedly from the magnetic field generator 2. Here, the warm air or cold air is supplied through the gas feed duct 36, serving as the supporting beam, so that any vibrational influence on the MR image can be avoided, even during a high-duty operation of the blowers, thus permitting an efficient gas supply with a stable maintenance of constant temperature of the growth circumstance.

Due to the fixed arrangement of the detection unit 4 and the sample holder 11, the MRI observation can be effected repeatedly or successively without incorporating any additional operation of the tuning and shimming during the observation, after such an operation has been performed once at the start of the MRI observation.

Because of the isolated arrangement of the detection unit 4 and the sample holder 11 from the magnetic field generator 2, any shock occurring upon the introduction of the gradient magnetic field can never be transmitted to the sample 16, so that no disturbance in the MR signals is brought about and, thus, an image or spectrum of high accuracy can be obtained.

The MRI observation of a sample organism can be effected succeedingly, while maintaining a constant circumstance, so that it is possible to realize successive analyses of the physiological condition of a sample organism in a non-destructive way and, thus, to obtain temporally succeeding observation data for a programmed breeding and for improving the cultivation conditions.

Thus, a sample of a plant exhibiting a superior ability in the growth of root may be assessed to be superior in the erectability of the seedling and in the ability for actively striking the root upon direct planting. It is also possible to cultivate the sample, such as a germinated seed, which has been assessed to be ranked as superior by such MRI observation, in order to multiply it.

By the apparatus and the method according to the present invention, it is possible also to analyze the physiological condition of a sample of not only seeds of plants, but also other organisms such as tissues, calluses and microorganisms, by performing a series of observations by a combination of MRI analysis with MR spectral analysis of a pertinent compound during the course of the physiological change.

Figures 5A, 5B:
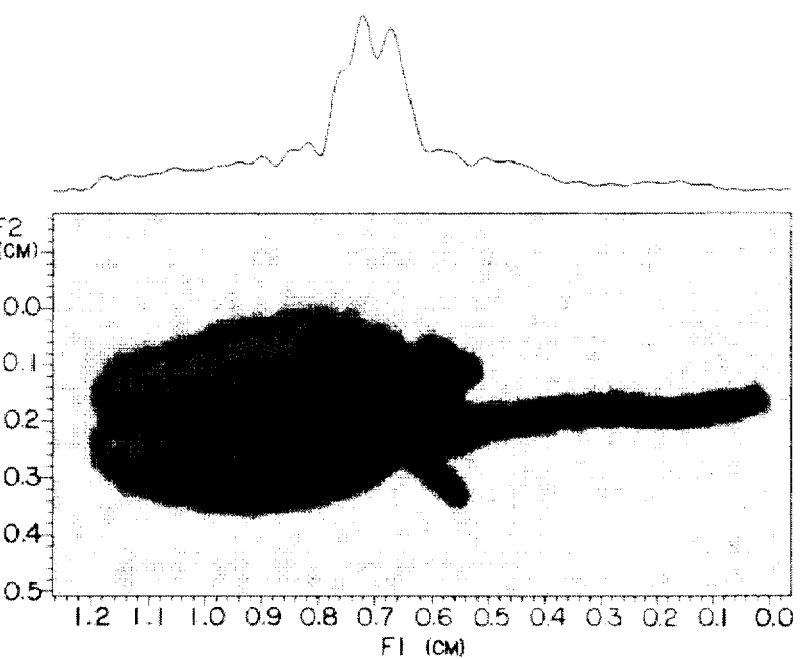
FIG. 5a shows a typical image by MRI after 28 hours' growing of a sample organism (wheat) and FIG. 5b is a spectrum corresponding to the above MRI image.

FIG. 5a shows the MR image of a seed of wheat (Norin No. 61) after 28 hours' growing at 30° C. and FIG. 5b illustrates the corresponding MR spectrum.

From these figures, it is possible to observe the course of growth of the embryo, the course of the extension of root and germ and the course of water absorption and decomposition of the stored starch and, by comparing these observed results with the MR spectral analysis data, the germination ability can be assessed.

We claim:

1. An apparatus for analyzing the physiological state of an organism, comprising:

a magnetic field generator for building up a stationary magnetic field and a gradient magnetic field within a hollow core space provided in the generator;

a detection unit provided within the hollow core space for containing the organism therein;

means for supporting the detection unit within the hollow space and isolating the detection unit from the magnetic field generator;

a circumstance regulator comprising a means for supplying a medium to the detection unit that alters the physiological state of the organism;

control means for regulating the temperature and quantity of the medium supplied to the detection unit; and an RF-emission-reception set comprising an RF coil provided within said hollow core space for emitting RF pulses to the organism in the detection unit and receiving magnetic resonance signals from the organism.

2. The apparatus of claim 1, wherein said hollow core space comprising said RF coil supports a sample holder containing the organism.

3. The apparatus of claim 1, wherein said medium is at least one of a gas and a liquid which is supplied to the detection unit.

4. The apparatus of claim 2, further comprising means for introducing said medium to the organism in the sample holder.

5. An apparatus for analyzing the physiological state of an organism comprising:

a magnetic field generator for building up a stationary magnetic field and a gradient magnetic field within a hollow core space provided in the generator;

a detection unit provided within the hollow core space for containing the organism therein and detecting the change in the physiological state of the organism;

means for supporting the detection unit within the hollow space and isolating the detection unit from the magnetic field generator;

a circumstance regulator comprising a means for supplying a medium to the detection unit that alters the physiological state of the organism;

control means for regulating the temperature and quantity of the medium supplied to the detection unit; and an RF-emission-reception set comprising an RF coil provided within said hollow space for emitting RF pulses to the organism in the detection unit and receiving magnetic resonance signals from the organism.

6. A method for analyzing the physiological state of an organism, comprising:

providing a magnetic field generator for building up a stationary magnetic field and a gradient magnetic field within a hollow core space provided therein;

placing a detection unit for containing the organism within the hollow core space;

supporting the detection unit in the hollow core space and isolating the detection unit from the magnetic field generator;

a circumstance regulator comprising a means for supplying a medium to the detection unit that alters the physiological state of the organism;

regulating the temperature and quantity of the medium supplied to the detection unit;

providing an RF-emission-reception set comprising an RF coil in said hollow core space;

emitting RF pulses to the organism in the detection unit and receiving magnetic resonance signals from the organism with the RF-emission-reception set; and processing the signals into corresponding image and/or spectrum data to analyze the physiological state of the organism.

7. The method of claim 6, further comprising the step of supporting a sample holder containing the organism within the hollow core space by said RF coil.

8. The method of claim 6, wherein said medium is at least one of a gas and a liquid.

9. The method of claim 7, further comprising the step of introducing the medium to the organism in the sample holder.

10. A method for analyzing the physiological state of an organism, comprising:

providing a magnetic field generator for building up a stationary magnetic field and a gradient magnetic field within a hollow core space provided therein;

placing a detection unit for containing the organism within the hollow core space;

supporting the detection unit in the hollow core space and isolating the detection unit from the magnetic field generator;

a circumstance regulator comprising a means for supplying a medium to the detection unit that alters the physiological state of the organism;

regulating the temperature and quantity of the medium supplied to the detection unit to effect a change in the physiological state of the organism;

providing an RF-emission-reception set comprising an RF coil in said hollow core space;

emitting RF pulses to the organism in the detection unit and receiving magnetic resonance signals from the organism with the RF-emission-reception set; and processing the signals into corresponding image and/or spectrum data to analyze the physiological state of the organism.

11. The apparatus of claim 1, wherein the alteration in physiological state is the growth of the organism.

12. The method of claim 6, wherein the alteration in physiological state is the growth of the organism.

* * * * *

UNITED STATES PATENT AND TRADEMARK OFFICE
CERTIFICATE OF CORRECTION

PATENT NO. : 5,759,797
DATED : June 2, 1998
INVENTOR(S) : Akira HORIGANE et al

It is certified that error appears in the above-identified patent and that said Letters Patent is hereby corrected as shown below:

Claim 6, Column 9, Lines 24-26;
change "a circumstance regulator comprising a means for supplying a medium to the detection unit that alters the physiological state of the organism"
to ---supplying a medium to the detection unit that alters the physiological state of the organism from a circumstance regulator---.

Claim 10, Column 10, Lines 18-20;
change "a circumstance regulator comprising a means for supplying a medium to the detection unit that alters the physiological state of the organism"
to ---supplying a medium to the detection unit that alters the physiological state of the organism from a circumstance regulator---.

Signed and Sealed this

Twenty-ninth Day of September, 1998

Attest:

BRUCE LEHMAN

*Attesting Officer*  *Commissioner of Patents and Trademarks*